United States Patent
Contarino

(10) Patent No.: US 10,670,255 B2
(45) Date of Patent: Jun. 2, 2020

(54) EVACUATED CORE CIRCUIT BOARD

(71) Applicant: Thin Thermal Exchange Pte. Ltd., Singapore (SG)

(72) Inventor: Aldo Contarino, North Perth (AU)

(73) Assignee: Thin Thermal Exchange Pte. Ltd., Singapore (SG)

( * ) Notice: Subject to any disclaimer, the term of this patent is extended or adjusted under 35 U.S.C. 154(b) by 0 days.

(21) Appl. No.: 15/755,524

(22) PCT Filed: Aug. 26, 2016

(86) PCT No.: PCT/AU2016/000297
§ 371 (c)(1),
(2) Date: Feb. 26, 2018

(87) PCT Pub. No.: WO2017/031528
PCT Pub. Date: Mar. 2, 2017

(65) Prior Publication Data
US 2018/0209632 A1    Jul. 26, 2018

(30) Foreign Application Priority Data
Aug. 26, 2015    (AT) .................... 2015903457

(51) Int. Cl.
*F21V 29/00* (2015.01)
*F21V 29/51* (2015.01)
(Continued)

(52) U.S. Cl.
CPC .............. *F21V 29/70* (2015.01); *F21V 29/74* (2015.01); *F21V 29/85* (2015.01); *F21V 29/89* (2015.01);
(Continued)

(58) Field of Classification Search
CPC .......... F21V 29/00; F21V 29/02; F21V 29/30; F21V 29/51; F21V 29/56; F21V 3/00; F21V 3/02; H05K 3/284
(Continued)

(56) References Cited

U.S. PATENT DOCUMENTS 8,201,971 B2    6/2012    Chen
2005/0258438 A1*   11/2005    Arik .................... F21K 9/00
                                                                257/88
(Continued)

FOREIGN PATENT DOCUMENTS

WO    2014039405 A1    3/2014

OTHER PUBLICATIONS

Int'l Search Report & Written Opinion (PCT/AU2016/000297), dated Nov. 11, 2016.

*Primary Examiner* — Xiaoliang Chen
(74) *Attorney, Agent, or Firm* — Hunton Andrews Kurth LLP

(57) ABSTRACT

An evacuated core circuit board (10) for dissipating heat from a heat generating electronic component, the evacuated core circuit board comprising: at least one circuit layer (12) to which the heat generating electronic component (14) is electronically coupled; a base layer (16) a comprising a body structure (19) having a substantially hollow interior (20); and a dielectric layer (18) provided between at least a portion of the circuit layer (12) and the base layer (16), wherein the hollow interior (20) is at least partially evacuated.

19 Claims, 3 Drawing Sheets

(51) Int. Cl.
*F21V 29/56* (2015.01)
*F21V 3/00* (2015.01)
*F21V 29/70* (2015.01)
*H05K 1/02* (2006.01)
*F21V 29/85* (2015.01)
*F21V 29/89* (2015.01)
*F21V 29/74* (2015.01)
*H05K 1/05* (2006.01)
*H05K 1/18* (2006.01)
*H05K 3/06* (2006.01)
*H05K 3/28* (2006.01)
*F21Y 115/10* (2016.01)
*F21Y 103/10* (2016.01)
*H05K 3/00* (2006.01)

(52) U.S. Cl.
CPC ......... *H05K 1/0204* (2013.01); *H05K 1/0209* (2013.01); *H05K 1/05* (2013.01); *H05K 1/181* (2013.01); *H05K 3/06* (2013.01); *H05K 3/285* (2013.01); *F21Y 2103/10* (2016.08); *F21Y 2115/10* (2016.08); *H05K 1/056* (2013.01); *H05K 3/0061* (2013.01); *H05K 2201/0141* (2013.01); *H05K 2201/0209* (2013.01); *H05K 2201/0257* (2013.01); *H05K 2201/037* (2013.01); *H05K 2201/09036* (2013.01); *H05K 2201/10106* (2013.01); *H05K 2201/10416* (2013.01); *H05K 2201/10522* (2013.01); *H05K 2203/0307* (2013.01); *H05K 2203/1338* (2013.01)

(58) Field of Classification Search
USPC ............ 174/260; 362/184, 249.2, 294, 373; 165/80.2, 104.26, 185; 257/88, 99, 714, 257/E23.098, E23.099
See application file for complete search history.

(56) References Cited

U.S. PATENT DOCUMENTS

| | | | |
|---|---|---|---|
| 2007/0139938 A1* | 6/2007 | Petroski | F21V 29/02 362/373 |
| 2007/0147046 A1* | 6/2007 | Arik | F21V 29/02 362/294 |
| 2007/0230135 A1 | 10/2007 | Feger et al. | |
| 2009/0021944 A1 | 1/2009 | Lee et al. | |
| 2010/0078151 A1* | 4/2010 | Koenigsberg | F28D 15/046 165/104.26 |
| 2010/0181585 A1 | 7/2010 | Juestel et al. | |
| 2010/0225219 A1* | 9/2010 | Hua | F21V 23/02 313/46 |
| 2011/0080740 A1* | 4/2011 | Allen | F21V 3/00 362/294 |
| 2011/0080742 A1* | 4/2011 | Allen | F21V 3/00 362/294 |
| 2011/0089830 A1* | 4/2011 | Pickard | F21V 29/54 315/32 |
| 2011/0204261 A1* | 8/2011 | Dahm | F21V 29/30 250/492.1 |
| 2011/0240260 A1* | 10/2011 | Van Der Tempel | F21V 29/02 165/80.2 |
| 2012/0268936 A1* | 10/2012 | Pickard | F21K 9/90 362/249.02 |
| 2012/0307500 A1 | 12/2012 | Hitchcock et al. | |
| 2013/0021789 A1* | 1/2013 | Dahm | B05D 3/067 362/184 |

* cited by examiner

EVACUATED CORE CIRCUIT BOARD

TECHNICAL FIELD

The present invention relates to an evacuated core circuit board. It is intended that the evacuated circuit board of the present invention has application in dissipating heat from a heat generating electronic component. More specifically, the heat generating electronic component may be provided in the form of a LED.

BACKGROUND ART

The following discussion of the background art is intended to facilitate an understanding of the present invention only. The discussion is not an acknowledgement or admission that any of the material referred to is or was part of the common general knowledge as at the priority date of the application.

Electronic devices typically of several discrete integrated circuit packages on a single circuit board or printed circuit board (PCB). The computing power of these packages is rarely limited by their functional size within these devices but rather their total power consumption and heat generated. Smart phone devices use passive or conductive cooling within their systems, laptops use a combination of miniaturised conductive, phase change and fan forced cooling, and desktop computers use large fan forced and phase change cooling techniques to increase cooling efficiency. The smaller the device the greater the need for passive high speed conductive cooling.

A further use for PCBs is in Light Emitting Diode (LED) lamps. LED lamps are lamps or lights that have been assembled from an array of one or more LEDs. LED lamps have a lifespan and electrical efficiency that is several times better than incandescent lamps, and significantly better than most fluorescent lamps. This has seen LED lamps begin to replace incandescent lamps and fluorescent lamps in both commercial and residential applications. During this replacement period, LED lights have been made from LED lamps with standard light bulb connections and shapes (such as an Edison screw base or GU10 bayonet fitting) and are made compatible with the voltage supplied to the sockets. As the need for compatibility with existing fittings diminishes, newer fittings designed for LED lamps are emerging.

Despite the drastic improvement of LED lamps over conventional incandescent lamps and fluorescent lamps, there are still several limitations to LED lamps which must be addressed before they fully replace conventional lighting.

The major limitation of LED lamps is that LED efficiency and life span drop at higher temperatures. Most of the electricity in an LED is lost as heat rather than being transformed into light (about 70% heat and 30% light). If this heat is not removed the LEDs run at a high temperature, which not only lowers their efficiency, but also makes the LEDs less reliable than they might otherwise be. This therefore limits the power that can be used in LED lamps that are used to physically replace existing filament and compact fluorescent types. Accordingly, the management of heat in LED lamps, especially those that use high-power LEDs is essential.

One method of management of the heat In LED lamps is through the use of a metal core printed circuit board (MCPCB). In MCPCBs, the base material for the PCB is a thermally conductive metal, as opposed to cheaper boards constructed from insulating materials. Between the LED and the metal core there is provided a thermally conductive dielectric layer which acts as a thermal bridge between the LED and the metal core. A conventional heat sink may then be utilised to dissipate the heat transferred to the metal core. One problem associated with MCPCBs relates to ineffective heat distribution, which results in heat spots to form in certain areas of the board. The temperature differential between these heat spots and the remainder of the PCB can result in buckling and separation of the layers and improper heat transfer.

The heat sinks themselves also have limitations which are mainly related to the size restriction that comes with commercial and residential LED lamp installations. Whilst the spatial limitation can be improved by increasing the complexity of the heat sink and/or using special alloys in construction, this ultimately increases the cost of the LED lamp.

Another problem with LEDs that is particularly applicable to LED lamps is what is known as "efficiency droop". This refers to the decrease in luminous efficacy of LEDs as the electric current increases past a certain point. Accordingly, luminance is usually increased by combining multiple LEDs in one LED lamp. The associated need for more LEDs has significantly increased the production costs of LED lamps.

Throughout this specification, unless the context requires otherwise, the word "comprise" or variations such as "comprises" or "comprising", will be understood to imply the inclusion of a stated integer or group of integers but not the exclusion of any other integer or group of integers.

Throughout the specification, unless the context requires otherwise, the term "evacuated core" or variations thereof will be understood to imply at least some level of evacuation of the core and is not to be limited to complete or entire evacuation. Further, the term "evacuation" implies a pressure lower than atmospheric pressure.

SUMMARY OF INVENTION

In accordance with the present invention there is a provided an evacuated core circuit board for dissipating heat from a heat generating electronic component, the evacuated core circuit board comprising:
    at least one circuit layer to which the heat generating electronic component is electronically coupled;
    a base layer a comprising a body structure having a substantially hollow interior; and
    a dielectric layer provided between at least a portion of the circuit layer and the base layer,
wherein the hollow interior is at least partially evacuated.

In one form of the present invention, the base layer is constructed of metal.

The body structure can be any shape which surrounds a hollow interior. In one form of the present invention, the body structure is a unitary plate-like structure defined by substantially opposed top and a bottom faces.

As would be understood by a person skilled in the art, the term 'at least partially evacuated' refers to a pressure lower than atmospheric pressure within the hollow interior. This is achieved by reducing the volume of the gas within the hollow interior. It is understood by the Applicant that the at least partial evacuation of the hollow chamber allows for a rapid and even distribution of heat throughout the body structure and circuit board. By at least partially evacuating the hollow interior of the body structure it is envisaged that particles that would normally inhibit the propagation of thermal radiation are removed.

In one form of the present invention, the hollow interior contains air which has been partially evacuated. In an alternative form of the present invention, the hollow interior contains a phase change material at a reduced atmosphere. As would be understood by a person skilled in the art, a phase change material is a substance with a high heat of fusion, making it capable of storing and releasing large amounts of thermal energy. Preferably, the phase change material is selected from any one more of water, ammonia, deuterium oxide, sodium chloride, antimony, chlorofluorocarbons, hydrofluorocarbons, ethylene glycol, propylene glycol, perfluoropolyether fluorinated fluids, and heptane. Without wishing to be bound by theory, it is understood by the applicant that the choice of different phase change material is depended on the operating temperature of the electronic component. For example, at operating temperature above 1400° C., sodium chloride or antimony is suitable.

In an alternative form of the present invention, the body structure is cylindrical in shape. It is envisaged that the shape of the body structure will be dependent on a number of factors, including the arrangement of the heat sources on the circuit layer and the application to which the evacuated core circuit board is utilised.

Preferably, when the body structure is a unitary plate-like structure, the top and bottom faces are substantially evenly spaced apart to define the hollow interior of the body structure. More preferably, the top and bottom faces are substantially evenly spaced apart over a substantial portion of their interior surface area.

In one form of the present invention, the heat generating electronic component is an LED light.

It is envisaged that where heat generating electronic component has its own heat slug, that the heat slug may be bonded directly to the base layer. Preferably, the heat slug is reflowed to, or directly deposited on the base layer. It is envisaged that the heat slug could form part of the electrical conduction path if required.

In one form of the present invention, the evacuated core circuit board further comprises a bonding agent to directly connect the heat generating component to the base layer of the board. Preferably, the bonding agent is selected from gold, silver, bronze, tin-lead solders and lead free solders. More preferably, the lead free solders are selected from tin-silver-copper solders; tin-silver-copper-zinc solder and tin-silver-copper-manganese solders.

In one form of the present invention, the application of the bonding agent and bonding of the components is by way of any means known in the art. Preferably, the bonding agent is applied by any one of solder reflow; sputtering, vacuum deposition, chemical bonding, electroplating, induction welding/soldering, and electron beam welding. More preferably, the application of the bonding agent is performed by way of a solder reflow process.

The circuit layer is preferably a low electrical resistance metal such as copper, silver, gold, aluminium.

The dielectric layer is composed of a dielectric material which is electrically insulating, but thermally conductive. The dielectric layer may comprise at least one of plastic and elastic materials, glass, ceramic, Pre-Preg (glass fibre), fibre, carbon fibre/tube, thermally conductive polymers and clad. In one form of the present invention, the thermally conductive polymer is a liquid crystalline polymer (LCP). As would be understood by a person skilled in the art, LCPs are partially crystalline aromatic polyesters based on p-hydroxybenzoic acid and related monomers. In an alternative form of the present invention, the thermally conductive polymer is an NCO backbone polymer.

In a further form of the present invention, the dielectric layer is elemental carbon which has a crystalline structure configured in a way to be electrically insulating. Preferably, the carbon is applied by way of low temperature vacuum deposition. Preferably the carbon is deposited onto the base at a thickness of approximately 2.0 nm. It is understood by the applicant that this configuration provides a high thermal conduction rate while maintaining good electrical insulating properties.

As would be understood by a person skilled in the art, the thickness and structure of the dielectrics layer must be designed so the circuit layer does not short out, yet maintain high thermal performance. In one form of the present invention, the thickness of this layer is between 2.0 nanometres to 0.2 mm. It is envisaged that thicker or thinner layers can be used depending on voltage and current of the electrical components.

The dielectric layer can be applied base layer through any conventional means known in the art. In one form of the present invention, the dielectric layer is applied to the base layer through physical vapour deposition. In an alternative form of the present invention, the dielectric layer is applied to the base layer through sputter deposition. In a further alternative form the dielectric layer is applied to the base layer through evaporation techniques. As would be understood by the person skilled in the art, evaporation techniques include the dispersion of the dielectric compound into a solvent which is then evaporated or set following application.

In one form of the present invention the base layer forms part of the circuit layer. In this form of the invention, the surface of the base layer is deposited with sections of conductive layers and dielectric layers.

In an alternative form of the invention, the dielectric layer is applied to the surface and portions are etched away to reveal conductive portions. As would be understood by a person skilled in the art, the etching can be achieved by way of chemical or photonic (laser) means.

In one form of the present invention the surface of the hollow interior may be treated with a surface treatment material. Preferably, the surface treatment material has a high Debye temperature. More preferably, the surface treatment has a highly ordered crystalline structure. In one form of the present invention, the surface treatment material is any one or more of carbon, beryllium, sapphire, titanium dioxide, titanium nitride, titanium carbonate, hafnium diboride, zirconium diboride, titanium diboride, scandium nitride, vanadium carbide chromium, ruthenium, silicone and calcium carbonate. In one form of the present invention, the surface treatment material has a Debye temperature of at least 600 k. More preferably, the surface treatment material has a Debye temperature of at least 1000 k. As would be understood by a person skilled in the Debye temperature of a material is in effect a numerical representation of the atomic structure of the material and relates to the way energy is held within the solid.

In one form of the present invention, the surface treatment material is nanoparticulate. Preferably, the mean particle size of the surface treatment material is between about 1 to 40 nm.

In one form of the present invention the top face and bottom face are provided with a featured surface. Preferably, the featured surface comprises a number of surface area accentuating corrugations. More preferably, the profile of the corrugations is sinusoidal or of a fin like configuration. Still preferably, the height of the corrugations is no more than three times the width of the body structure.

Preferably, the body structure is constructed of a material with low thermal and electrical resistance, such as copper or aluminium. It is envisaged that portions of the body structure may be provided with a thermally insulating material in order to shield certain electronic components in the circuit from heat dissipated through the base layer.

In one form of the present invention, the base layer and body chamber may compromise part of the electrical circuit as a positive or negative rail.

In a preferred form of the present invention the corrugations extend across the surface of the unitary body in a direction offset from a latitudinal axis of the unitary body. Preferably, the corrugations extend across the surface of the unitary body in a direction 45 degrees from a latitudinal axis of the unitary body.

In one form of the present invention, the direction of the corrugations of the top surface of the unitary body are generally opposed to the direction of the corrugations of the bottom surface of the unitary body. Preferably the directions are opposed by 90 degrees. By providing opposing the direction of corrugations of the top surface and the bottom surface of the unitary body the Applicant understands that the thermal radiation radiated from the top surface will mix with the localised air and vortex with the thermally excited air from the bottom surface and flow away from the body structure. This vortex is highly advantageous to the heat sink design as it dissipates the heat without the need for a fan.

By both increasing the efficiency and managing the extraneous thermal energy of the of the LED light source, the Applicant has been able to improve the overall performance of an LED lamp. In this manner, the maximum visible light may be utilised from the LED, whilst extraneous energy is whilst extraneous energy is removed from the LED lamp.

BRIEF DESCRIPTION OF THE DRAWINGS

Further features of the present invention are more fully described in the following description of several non-limiting embodiments thereof. This description is included solely for the purposes of exemplifying the present invention. It should not be understood as a restriction on the broad summary, disclosure or description of the invention as set out above. The description will be made with reference to the accompanying drawings in which.

DESCRIPTION OF EMBODIMENTS

Figure 1:
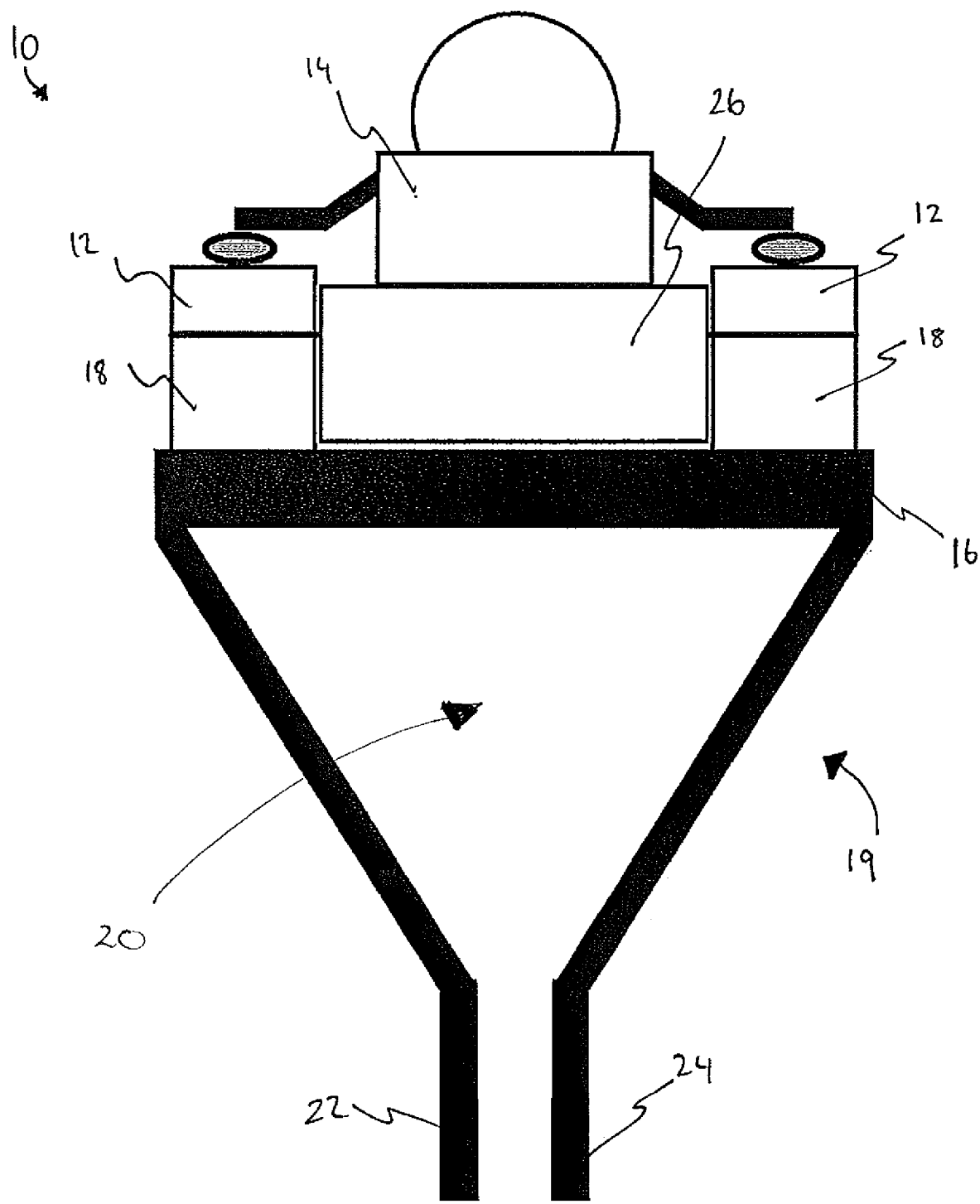
FIG. 1 is a cross sectional view of an evacuated core circuit board in accordance with a first aspect of the present invention.
Figure 2:
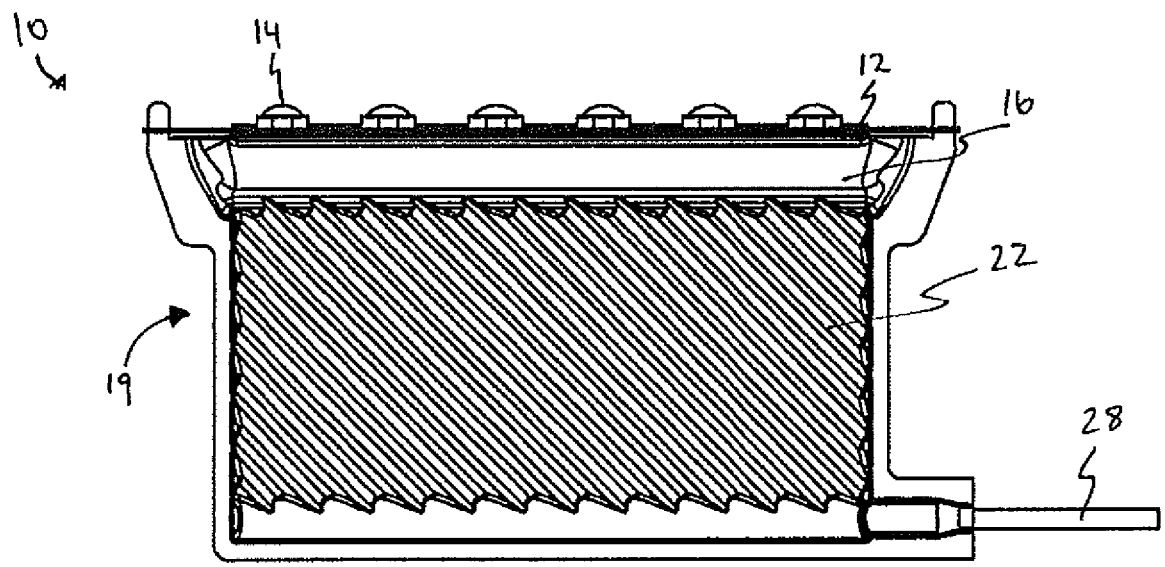
FIG. 2 is side view drawing of the evacuated core circuit board in accordance with the first aspect of the present invention.
Figure 3:
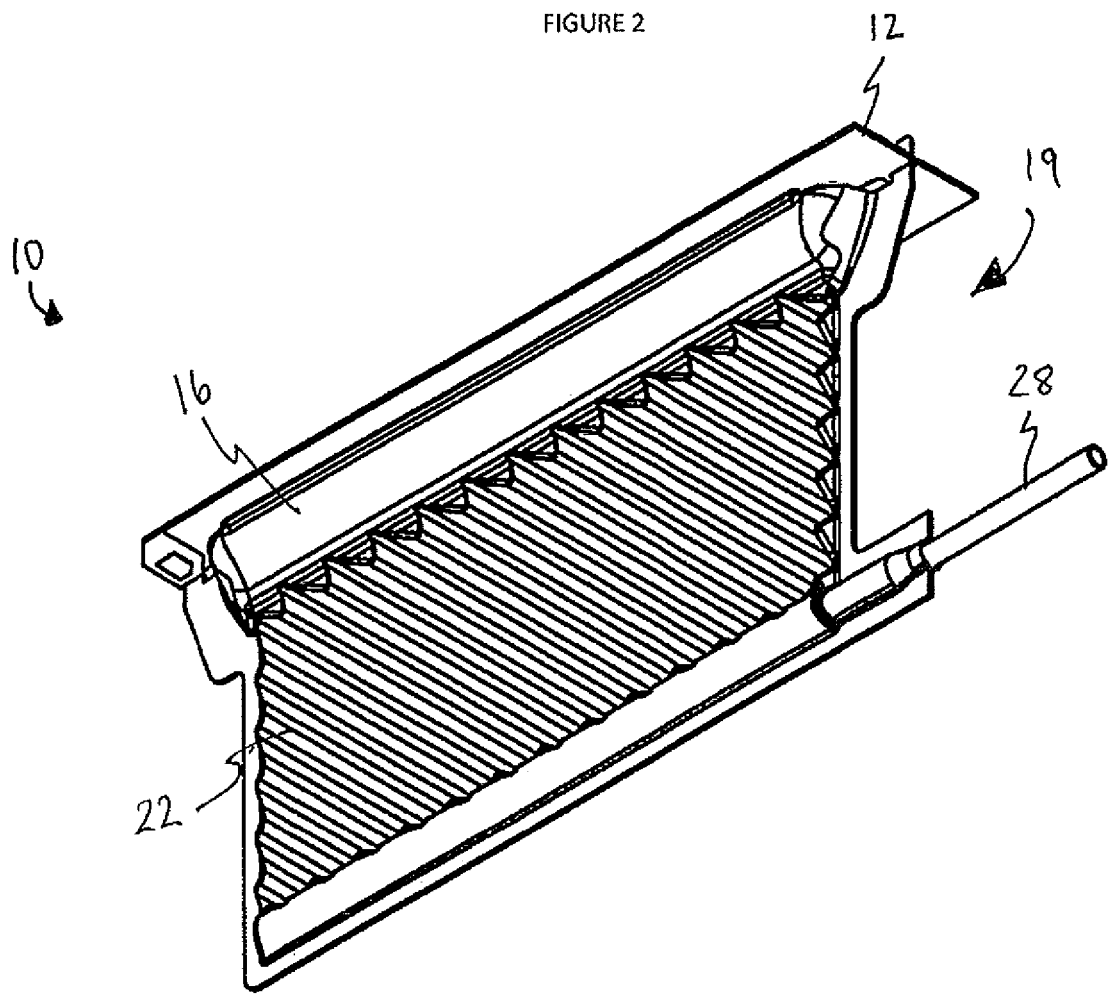
FIG. 3 is an upper perspective drawing of the evacuated core circuit board in accordance with the first aspect of the present invention.

In FIGS. 1 to 3 there is shown an evacuated core circuit board 10 in accordance with the present invention. The evacuated core circuit board 10 comprises a circuit layer 12 to which a heat generating electronic component, for example a LED 14 is electronically coupled to. The evacuated core circuit board 10 further comprises a base layer 16. A dielectric layer 18 is provided between at least a portion of the circuit layer 12 and the base layer 16. The dielectric layer 18 is electrically insulating, to prevent the shorting of the LED 14. As shown in FIG. 1, at least one part of the LED can be directly bonded to the base layer. Alternatively, the LED may be bonded to the circuit layer which is on or in the dielectric layer.

The base layer 16 comprising a body structure 19 with a substantially hollow interior 20. The substantially hollow interior 20 is coated with a surface coating (not shown). The base layer 16 is constructed of a unitary plate like structure with a top face 22 and bottom face 24.

It is well understood that the heat may propagate by way of conduction, convection or radiation. Typical heat transfer methods used in electronics rely on conduction to remove heat from the heat source. In this arrangement, the speed at which the heat can be removed from the heat source is limited by the speed at which heats conducts through the solid. It is understood by the applicant that by providing the body structure 19 with a hollow interior, that at least a portion of the heat generated by the heat source may be transferred by way of radiation through the hollow interior 20. As would be understood by person skilled in the art, the speed at which heat propagates by way of radiation is much faster than that of conduction.

The difficulty faced in the design of a hollow interior 20 that demonstrates a suitably high rate of radiation is to increase the amount of heat that is emitted from the solid surface into the hollow interior, such that its speed competes with conduction through the solid.

As would be understood by a person skilled in the art, when the temperature of a body is greater than absolute zero, inter-atomic collisions cause the kinetic energy of the atoms or molecules to change. This results in charge-acceleration and/or dipole oscillation which produces electromagnetic radiation.

Without wishing to be bound by theory, the applicant understands that emissivity of a material is dependent on a number of factors. These factors include the material's chemical composition and physical structure, the temperature of the material, the Debye temperature of the material and associated phonon oscillation rates, the angle of passage of these oscillations, and finally the polarization of that material. These factors similarly affect the absorption of radiation. The fine tuning of any one of these factors may be used to improve the emission and absorption of heat by way of radiation.

The inventors have discovered that materials with a high Debye temperature or a low specific heat per mole more readily emit and absorb radiation. Without wishing to be bound by theory, this is understood to be due to the atomic structure of the material and the high rate of oscillation of particles at temperature.

As it is the dipole oscillation which produces radiation, emission of radiation can only occur at the surface of a material. Additionally, radiation can only occur once every dipole oscillation. Therefore, it is advantageous to use materials with high phonon oscillation rates and to maximise surface area. Without wishing to be bound by theory, the inventors have discovered that by coating the inner surface of the hollow interior with a surface coating that comprises crystalline nanoparticles in the size range of about 1 to 40 nm the surface area and transmission speed may be increased. By increasing the emitting and absorbing surfaces area, heat transfer is also increased. Additionally, particle size may also be inversely proportional to the materials heat transfer speed. Materials need to be chosen carefully as their particle size will influence structure and Debye temperature.

The rate of the dipole oscillation dictates the emission wavelength, with the oscillation rate dictated by the phonon oscillation rate. Materials that can handle high rates of oscillation will permit more transfer. Ideally, the accepting material will have a similar wavelength and phonon oscillation to the emitting material and should subsequently be matched. This is understood to provide the maximum heat transfer through the hollow interior 22.

In the embodiment shown in FIGS. 1 to 3, the body structure 19 is plate-like, though it is envisaged that the shape may be adapted to the particular heat source. For example, the body structure 19 may be sized and shaped for use with mobile telephones or within laptops and personal computers.

Where the heat generating electronic component has its own heat slug 26, the heat slug is directly reflowed to the base layer through a hole in the dielectric layer 18.

Both the top face 22 and the bottom face 24 are provided with a series of corrugations along their surfaces. In the embodiment shown in FIGS. 2 and 3, the directions of the corrugations are offset 45 degrees from the lateral axis of the base layer 16. The corrugations of the top face 22 and the bottom face 24 are offset by 90 degrees.

The hollow interior 20 is evacuated by way of an evacuation tube 28. Once the hollow interior has been evacuated, the evacuation tube 28 is sealed in order to maintain a vacuum therein.

By both increasing the efficiency and managing the extraneous thermal energy of the of the LED light source, the Applicant has been able to improve the overall performance of an LED lamp. In this manner, the maximum visible light may be utilised from the LED, whilst extraneous energy is removed from the LED lamp.

Example 1

As discussed previously, the Inventors have identified that the use of the metal core circuit board for dissipating heat from a LED light source. The difficulty faced in the manufacture of the LED lamps is that whilst higher currents result in higher light levels from the LED light source, it also increases the operating temperature of the LED. This increase in operating temperature also reduces the efficiency of LED light sources. Typical conductive heat sinks only allow the current to be increased to a certain point before the LED efficiency is affected as a result of heat generation. To compare the metal core circuit board of the present invention to typical heat sinks, series of test were performed which compared the effect that increased current had on a single 1 watt LED on the metal core circuit board of the present invention against an identical single 1 watt LED cooled by industry standard heat sinking technology. The base layer of the metal core circuit board was constructed of 99.98% pure copper which has been pressed into a unitary plate-like structure defined by substantially opposed top and a bottom faces. The hollow interior was coated in surface treatment material comprised of Nanoparticles within the size range of about 1 to 40 nm, the materials were elemental or molecular in nature and included sapphire nanoparticles, carbon nanoparticles, titanium nitride nanoparticles, and calcium carbonate nanoparticles. It is understood by the Inventors that multiple nanoparticle elements or molecules can be used. The materials were mixed in even quantities with approximately 50 mg of material being injected within the chamber and evenly coating the surface. Following coating, the chamber was evacuated and sealed. A single LED was solder to the circuit layer.

Each single 1 watt LED had a specified run current of 0.35 A. The increase in current through each LED was made over a number of steps, with each step in current being maintained for 5 minutes before increasing the current to the next step. The results of the test are shown in FIG. 4.

Figure 4:
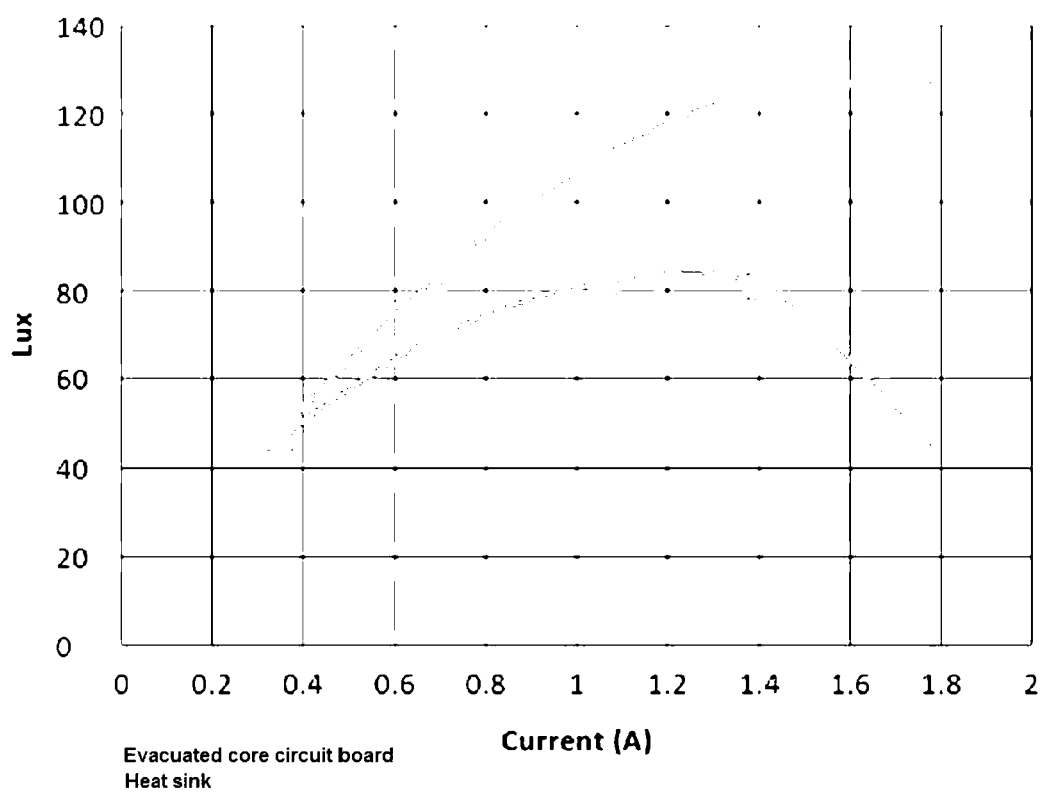
FIG. 4 is a graphical representation of the results of Example 1.

As can be seen from FIG. 4, at 0.35 A the lux is quite similar between the two products. There then is a rapid divergence at 2× run current. At 3× to 4× run current there is a thermal cascade where the heat the LED is producing causes the light levels to drop even though more power is being supplied.

Whilst Example 1 demonstrated the advantages of the evacuated core circuit board of the present invention with respect to a single LED light, this effect is compounded in commercial uses of LED lights. In an attempt to increase light output, commercial manufacturers place more LEDs on their boards to compensate for lower light output at lower operating current. Typical commercial LED light can have up to nine LEDs on a single board. As identified by the inventors, light output is proportionate to the temperature and it understood that the temperature of the LED junction and ultimately the speed of heat transfer through the heatsink plays and important factor in overall light output. In the aforementioned commercial example, there are nine separate LEDs which each contribute to the overall heat and therefor the overall light efficiency. By improving the capabilities of the heatsink, the inventors have discovered that more light will be produced with a higher reliability, using less LEDs.

Those skilled in the art will appreciate that the invention described herein is susceptible to variations and modifications other than those specifically described. The invention includes all such variation and modifications. The invention also includes all of the steps, features, formulations and compounds referred to or indicated in the specification, individually or collectively and any and all combinations or any two or more of the steps or features.

The invention claimed is:

1. An evacuated core circuit board for dissipating heat from a heat generating electronic component, the evacuated core circuit board comprising: at least one circuit layer to which the heat generating electronic component is electronically coupled; a base layer a comprising a body structure having a substantially hollow interior, which is sealed; and a dielectric layer provided between at least a portion of the circuit layer and the base layer, wherein the hollow interior is at least partially evacuated and wherein the inner surface of the hollow interior may be treated with a surface treatment material wherein the surface treatment material is nanoparticulate.

2. An evacuated core circuit board according to claim 1, where the body structure is a unitary plate-like structure defined by substantially opposed top and a bottom faces.

3. An evacuated core circuit board according to claim 2, wherein the top and bottom faces are substantially evenly spaced apart to define the hollow interior of the body structure.

4. An evacuated core circuit board according to claim 2, wherein the top and bottom faces are substantially evenly spaced apart over a substantial portion of their interior surface area.

5. An evacuated core circuit board according to claim 1, wherein the hollow interior contains air which has been partially evacuated.

6. An evacuated core circuit board according to claim 1, wherein the hollow interior contains a phase change material at a reduced atmosphere.

7. An evacuated core circuit board according to claim 1, wherein the heat generating electronic component is an light emitting diode (LED) light.

8. An evacuated core circuit board according to claim 1, further comprising a bonding agent layer between the circuit layer and the base layer for bonding the circuit layer to the base layer.

9. An evacuated core circuit board according to claim 1, wherein the base layer forms part of the circuit layer.

10. An evacuated core circuit board according to claim 9, wherein the surface of the base layer is deposited with sections of conductive layers and dielectric layers.

11. An evacuated core circuit board according to claim 9, wherein the dielectric layer is applied to the surface of the conductive layer and portions are etched away to reveal conductive portions.

12. An evacuated core circuit board according to claim 1, wherein the surface treatment material has a high Debye temperature.

13. An evacuated core circuit board according to claim 1, wherein the internal surface treatment material has a Debye temperature of at least 600 k.

14. An evacuated core circuit board according to claim 1, wherein the surface treatment material is any one or more of carbon, beryllium, sapphire, titanium dioxide, titanium nitride, titanium carbonate, hafnium diboride, zirconium diboride, titanium diboride, scandium nitride, vanadium carbide, chromium, ruthenium, silicone and calcium carbonate.

15. An evacuated core circuit board according to claim 1, wherein the mean particle size of the surface treatment material is about 1 to 40 nm.

16. An evacuated core circuit board according to claim 2, wherein the top face and bottom face are provided with a featured surface.

17. An evacuated core circuit board according to claim 16, wherein the featured surface comprises a number of surface area maximising corrugations.

18. An evacuated core circuit board according to claim 17, wherein the corrugations extend across the surface of the unitary body in a direction offset from a latitudinal axis of the unitary body.

19. A LED lamp array, the lamp array comprising: one or more LEDs arranged on the evacuated core circuit board of claim 1.

* * * * *